(12) United States Patent
Chang

(10) Patent No.: US 7,140,423 B2
(45) Date of Patent: Nov. 28, 2006

(54) FINNED HEAT DISSIPATION MODULE HAVING FLOW GUIDE

(75) Inventor: Juei-Chi Chang, Taipei (TW)

(73) Assignee: Mitac Technology Corp., Hsin-Chu Hsien (TW)

( * ) Notice: Subject to any disclaimer, the term of this patent is extended or adjusted under 35 U.S.C. 154(b) by 0 days.

(21) Appl. No.: 11/062,822

(22) Filed: Feb. 23, 2005

(65) Prior Publication Data

US 2005/0252640 A1    Nov. 17, 2005

(30) Foreign Application Priority Data

May 13, 2004    (TW) ................................ 93113427 A

(51) Int. Cl.
*H05K 7/20* (2006.01)

(52) U.S. Cl. ................. 165/104.33; 165/121; 361/697; 361/700

(58) Field of Classification Search ............... 165/80.3, 165/104.33, 121, 185; 361/697, 700
See application file for complete search history.

(56) References Cited

U.S. PATENT DOCUMENTS

| 3,265,127 | A | * | 8/1966 | Nickol et al. ............... 165/152 |
| 4,621,687 | A | * | 11/1986 | Ikuta et al. .................. 165/152 |
| 6,135,200 | A | * | 10/2000 | Okochi et al. ............... 165/121 |
| 6,590,770 | B1 | * | 7/2003 | Rogers et al. .............. 361/697 |
| 6,636,423 | B1 | * | 10/2003 | Rinella et al. .............. 361/703 |
| 6,732,786 | B1 | * | 5/2004 | Lee ............................. 165/80.3 |
| 2003/0007327 | A1 | * | 1/2003 | Fujiwara ..................... 361/697 |
| 2003/0192670 | A1 | * | 10/2003 | North et al. ............... 165/80.3 |
| 2004/0108100 | A1 | * | 6/2004 | Horng et al. .............. 165/80.3 |
| 2004/0244947 | A1 | * | 12/2004 | Chen ......................... 165/80.3 |

FOREIGN PATENT DOCUMENTS

TW             425053        3/2001

* cited by examiner

*Primary Examiner*—Allen J. Flanigan
(74) *Attorney, Agent, or Firm*—Rosenberg, Klein & Lee

(57) ABSTRACT

A heat dissipation module includes an airflow generation device that generates airflow into an air channel in which a fin module is received and fixed. The fin module includes a plurality of fin plates substantially parallel to and spaced from each other to define air passages extending from an inlet to an outlet of the air channel. Each fin plate has a trailing section extending to the outlet and forming at least one inclined guide tab and an opening defined in the fin plate immediately close to the guide tab for switching at least a portion of the air between adjacent air passages on opposite sides of the fin plate. This increases the length of the path that the air flows through the air channel and thus raises the amount of heat exchanged between the fin plates and the air thereby enhancing efficiency of heat removal.

20 Claims, 9 Drawing Sheets

FINNED HEAT DISSIPATION MODULE HAVING FLOW GUIDE

BACKGROUND OF THE INVENTION

1. Field of the Invention

The present invention relates generally to a heat dissipation module comprising fins, and in particular to a finned heat dissipation module having guides for switching airflow between different air passages to enhance efficiency of heat dissipation.

2. Description of the Prior Art

The development of computer technology makes the power consumption of a computer device dramatically increased. Thus, a heat dissipation module is commonly employed in the recent computer devices or other electronic devices to remove heat from the computer or electronic components that generate heat in order to maintain proper operation temperature of the computer or electronic devices. Some heat dissipation devices incorporate a fan that induces air streams flowing through the heat dissipation device to facilitate heat removal by forced heat convection.

Some conventional heat dissipation devices are comprised of fins arranged in rows with air passages formed therebetween. The air passages are often linear or straight to allow for easy flow of air therethrough. However, such a linear configuration limits heat exchange between the airflow and the fins for air flows through the fins quickly. As a consequence, the efficiency of heat removal is not optimal and the life span of the computer or electronic components is often reduced.

Factors that are often taken into consideration for overcoming heat removal problem include performance of the computer components, which leads to reduced energy consumption and generates less heat during the operation thereof, and geometric configuration, which enhances heat exchange rate between the heat generation component and a heat dissipation device for more efficient removal of heat.

A state-of-art heat dissipation module, generally employed in a notebook computer that requires more severe heat management than regular desktop computers, comprises a thermally conductive casing in physical contact with a surface of a heat source, such as a central processing unit of a notebook computer. The casing forms a fan chamber in which a fan is received and fixed and an air channel in which a plurality of fins is arranged to define a plurality of air passages through which airflow from the fan may pass to initiate heat exchange with the fins and thus removing heat from the fins, as well as the casing.

FIG. 1 of the attached drawings show an example of the conventional heat dissipation module housed in a casing. As mentioned above, the air channel of the heat dissipation module comprises a plurality of fin plates 100 parallel to each other to define a plurality of air passages 103 therebetween, each air passage extending from an inlet 101 to an outlet 102. Airflow 105 generated by a fan often moves in a direction that is not parallel to the passages 103. Thus, when the airflow enters the inlet 101, the air goes in an oblique direction and impacts the surface of the fin plate 100, which imparts a resistance to the airflow, causing a turbulence 105a. Also, a secondary turbulence 105b is formed by the airflow "reflected" by the fin plate to hit an adjacent fin plate. The turbulences 105a, 105b are then combined in a downstream location, forming a substantially unified air stream 105 that passes through the air passage 103.

Although heat can be effectively carried out by the heat dissipation module described above, the heat dissipation module cannot offer the optimum efficiency in removing heat and usually makes great noises.

Thus, the present invention is aimed to provide a heat dissipation module that overcomes at least some of the drawbacks of the conventional devices.

SUMMARY OF THE INVENTION

An object of the present invention is to provide a finned heat dissipation module comprising an air channel in which airflow guides are arranged to optimize heat removal rate of the heat dissipation module.

Another object of the present invention is to provide a heat dissipation module comprising air channel in which airflow guides are arranged to increase the contact surface area between airflow and fin plates and to extend the time that is required for the airflow to pass through the air channel thereby enhancing heat exchange between the fin plates and the airflow.

To achieve the above objects, in accordance with the present invention, there is provided a heat dissipation module comprising an airflow generation device that generates airflow into an air channel in which a fin module is received and fixed. The fin module comprises a plurality of fin plates substantially parallel to and spaced from each other to define air passages extending from an inlet to an outlet of the air channel. Each fin plate has a trailing section extending to the outlet and forming at least one inclined guide tab and an opening defined immediately close to the guide tab for switching at least a portion of the air between adjacent air passages on opposite sides of the fin plate. This increases the length of the path that the air flows through the air channel and thus raises the amount of heat exchanged between the fin plates and the air thereby enhancing efficiency of heat removal.

BRIEF DESCRIPTION OF THE DRAWINGS

The present invention will be apparent to those skilled in the art by reading the following description of preferred embodiments thereof, with reference to the attached drawings, in which.

DETAILED DESCRIPTION OF PREFERRED EMBODIMENTS

Figure 1:
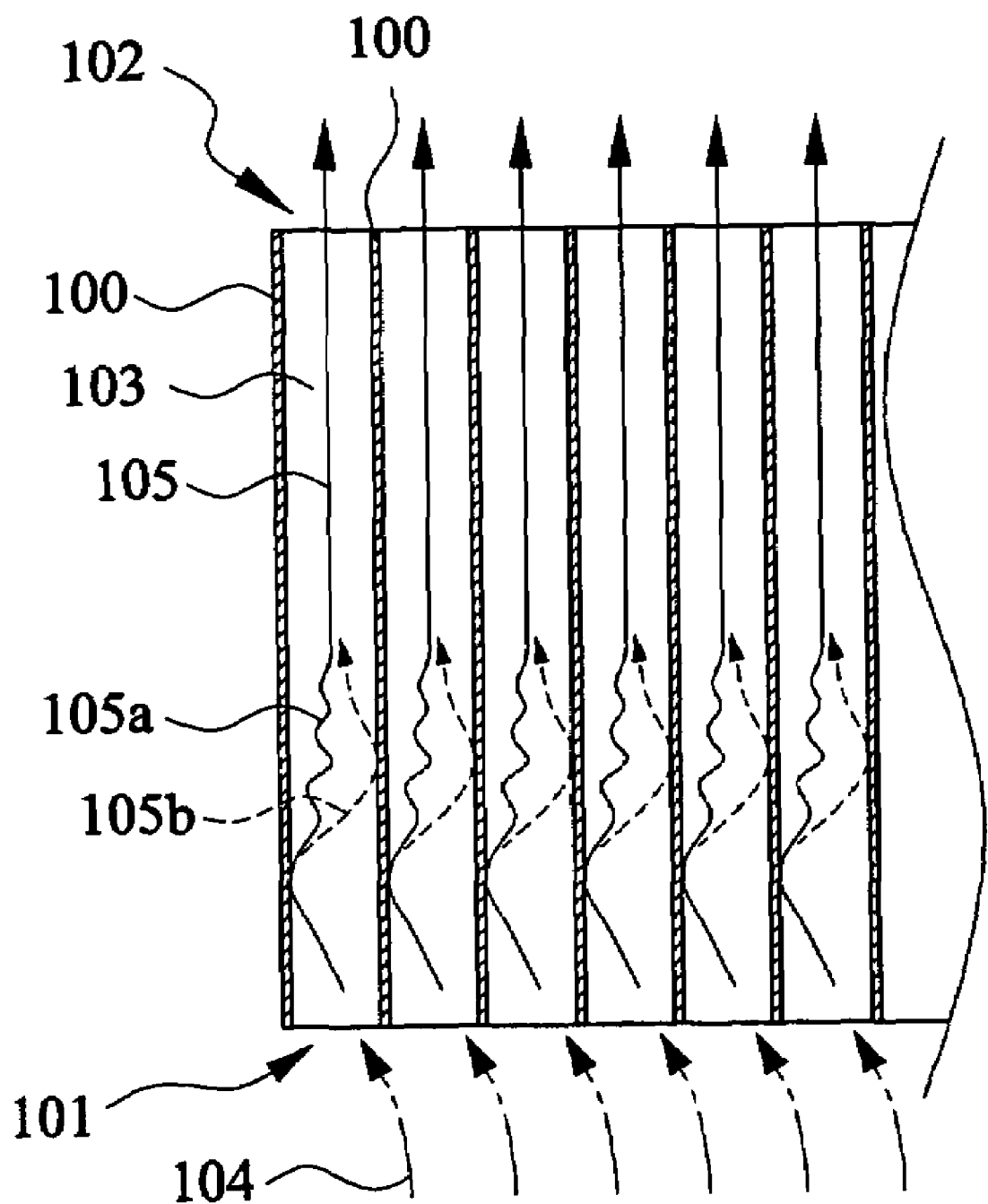
FIG. 1 is a cross-sectional view of an air channel of a conventional heat dissipation module.
Figure 2:
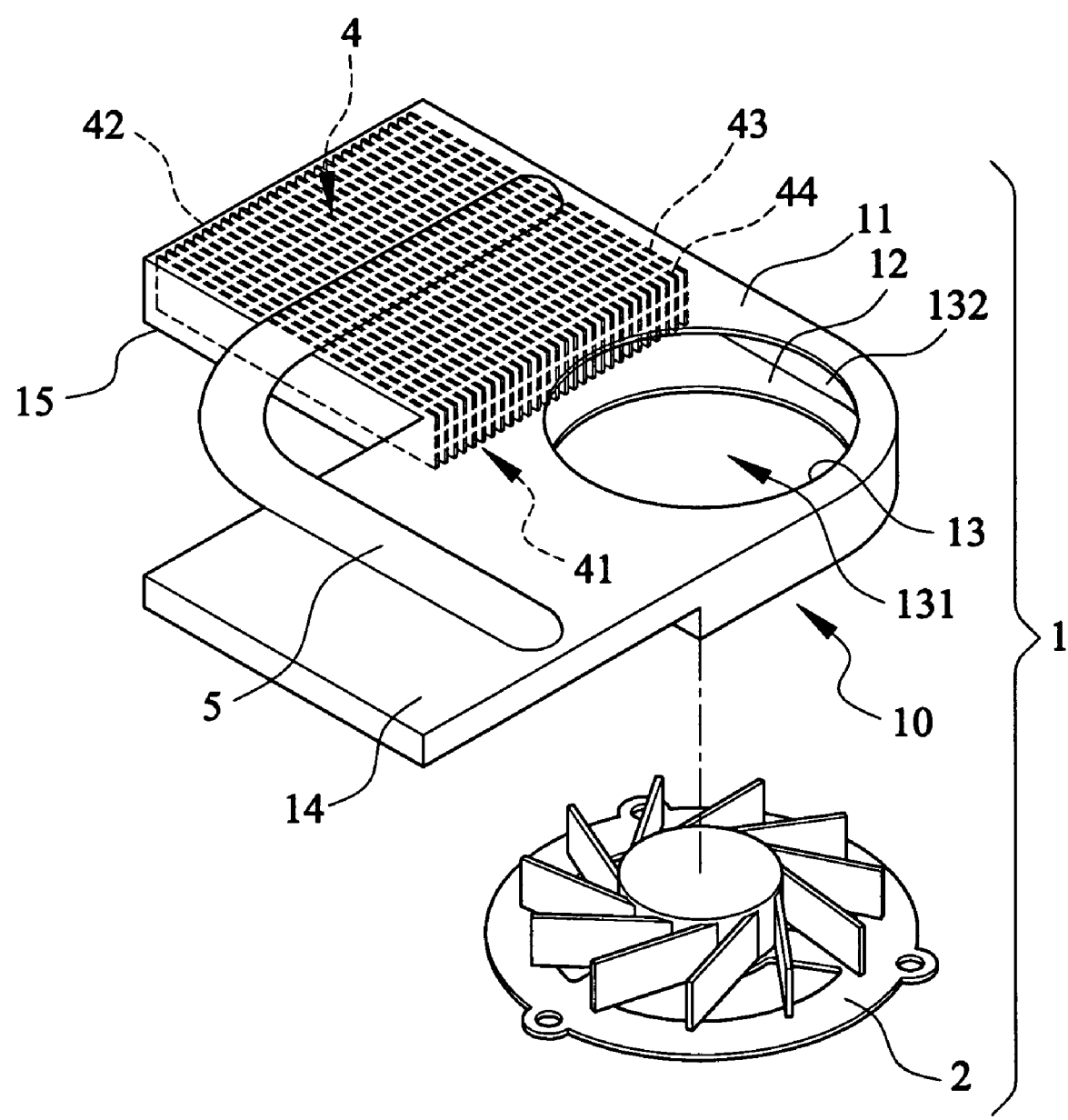
FIG. 2 is an exploded view of a heat dissipation module constructed in accordance with the present invention.
Figure 4:
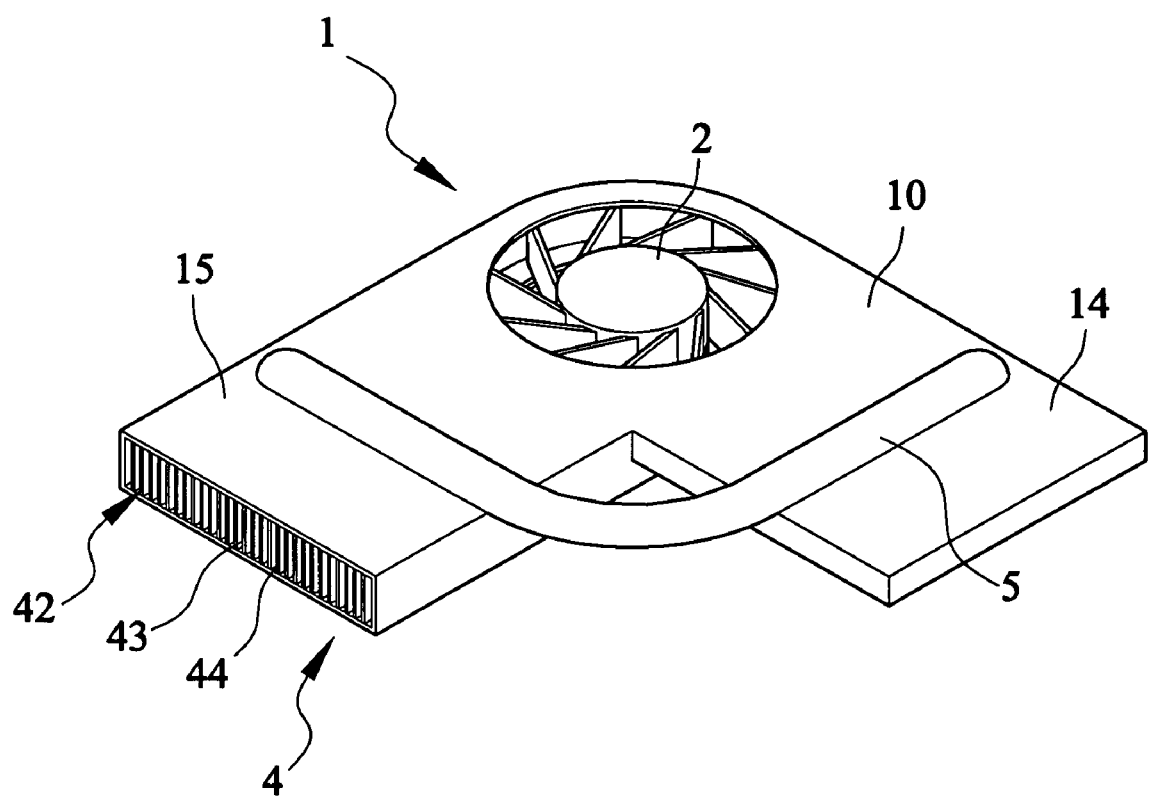
FIG. 4 is a perspective view of the heat dissipation module of the present invention.
Figure 5:
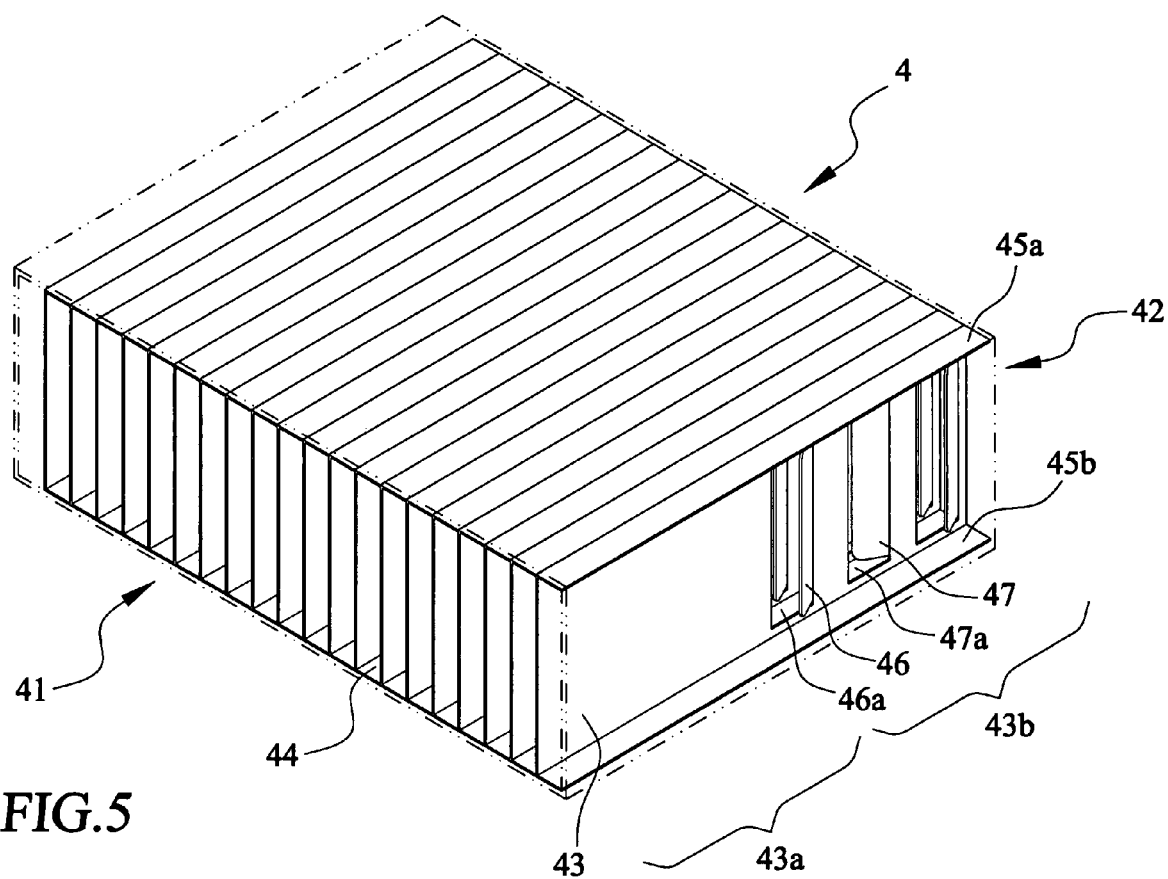
FIG. 5 is a perspective view of an air channel structure incorporated in the heat dissipation module of the present invention.
Figure 6:
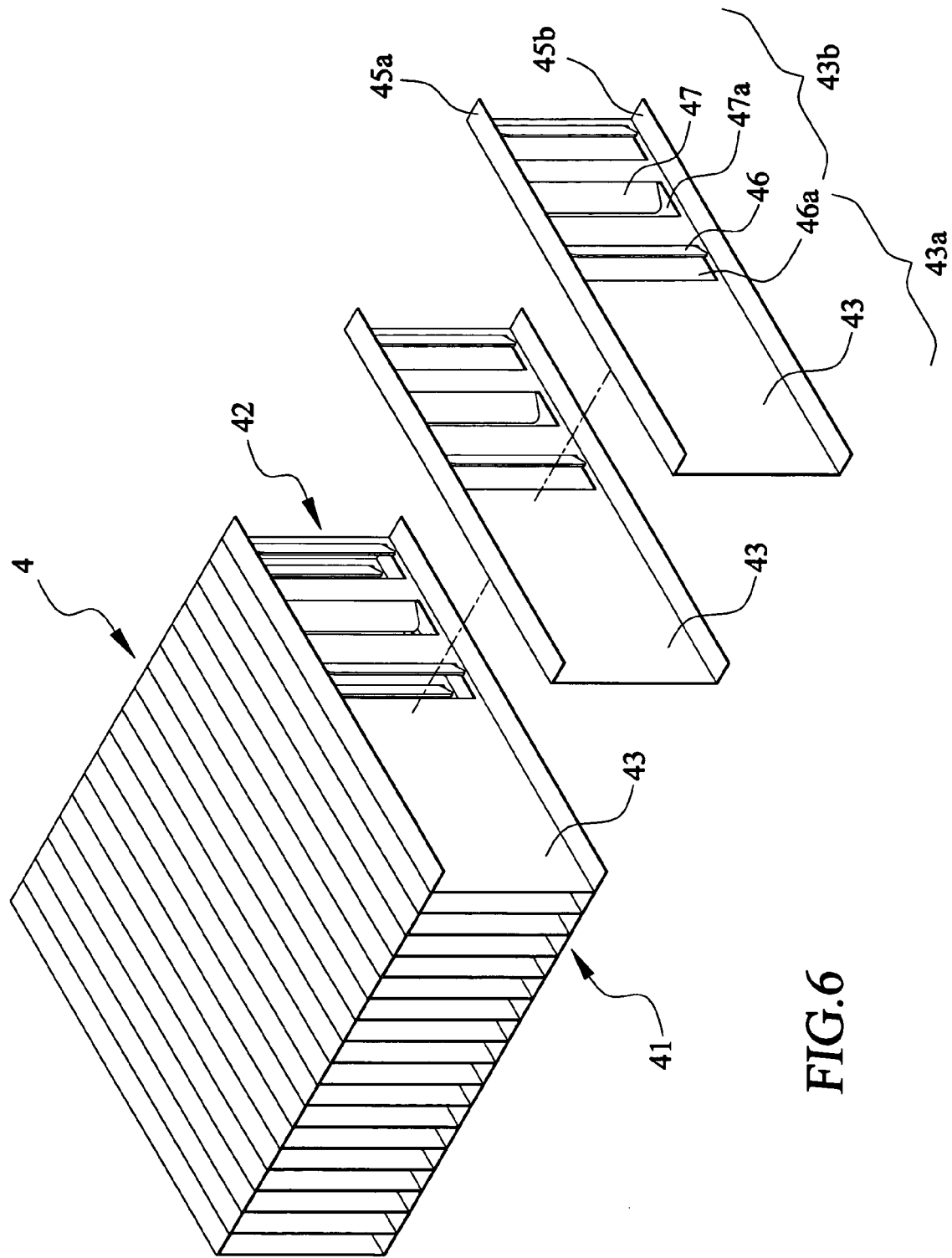
FIG. 6 is an exploded view of the air channel of the present invention.
Figure 7:
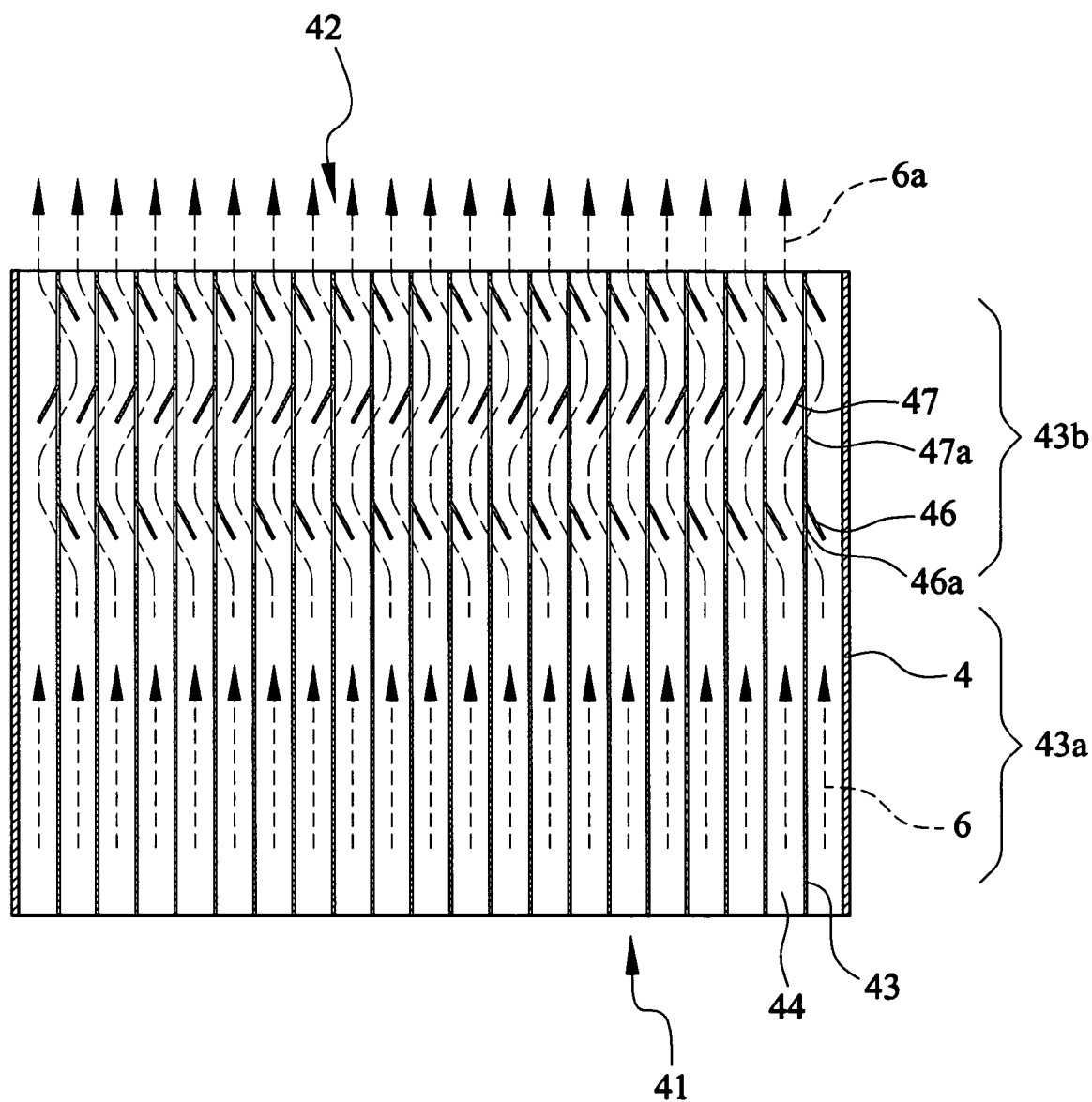
FIG. 7 is a cross-sectional view of the air channel of the present invention.
Figure 8:
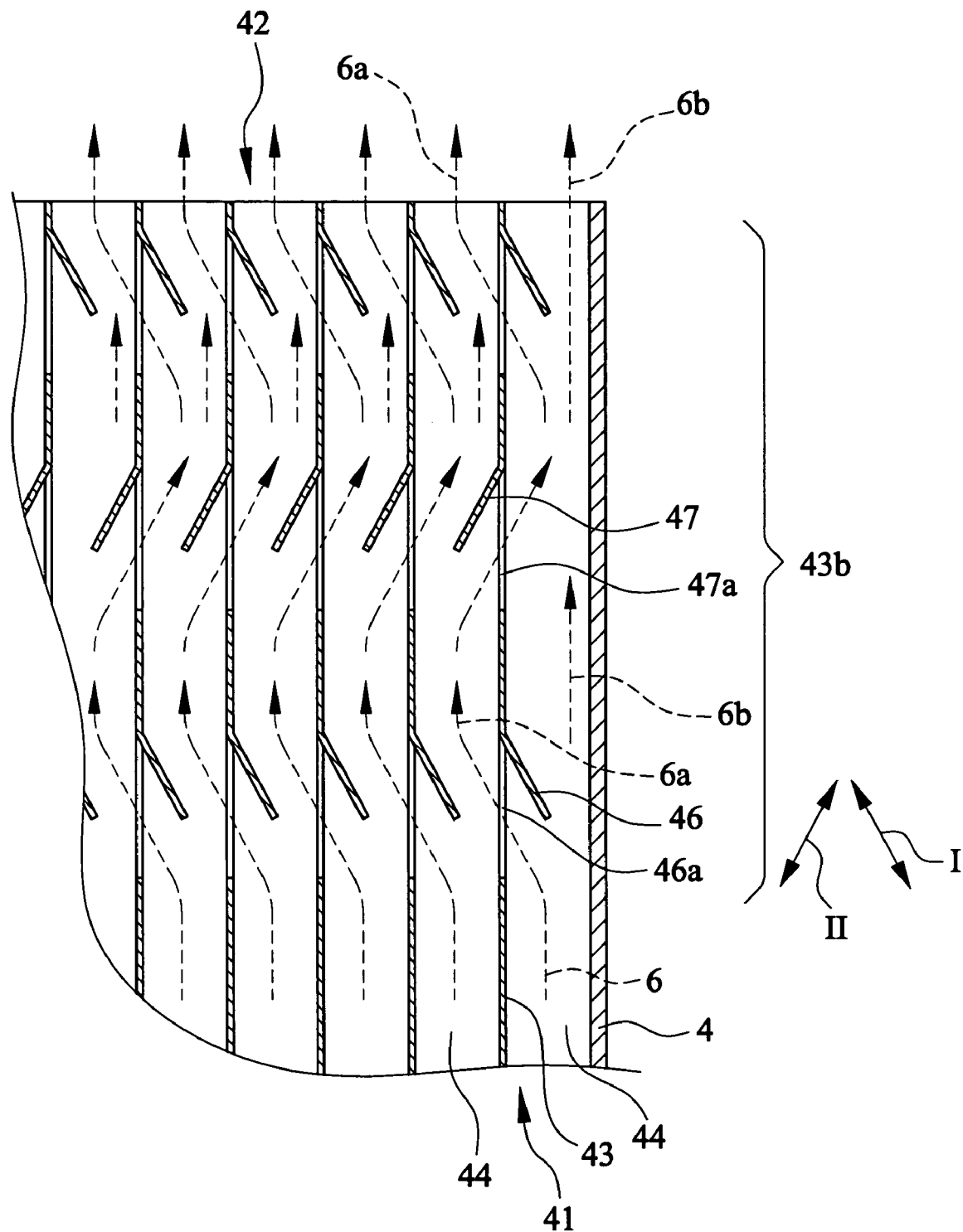
FIG. 8 is an enlarged view of a portion of the air channel illustrated in FIG. 7.

With reference to the drawings and in particular to FIGS. 2 and 4, a heat dissipation module constructed in accordance with the present invention, generally designated with reference numeral 1, comprises a casing or cartridge 10 made of thermally conductive material, comprised of a top panel 11 and a bottom panel 12 opposite to the top panel 11 with an interior space defined between the top and bottom panels 11, 12. Aligned openings (not labeled) are defined in the top and bottom panels 11, 12 to form a fan chamber 13 that receives and fixes an electric fan 2. The opening defined in the top panel for the fan 2 also constitutes an air intake opening 131 through which surrounding air may be drawn into the interior space of the casing 10 by the fan 2. A side opening 132 formed between outer edges of the top and bottom panels 11, 12 also provides an intake entrance for surrounding air into the interior space of the casing 10 by being drawn by the fan 2.

Figure 3:
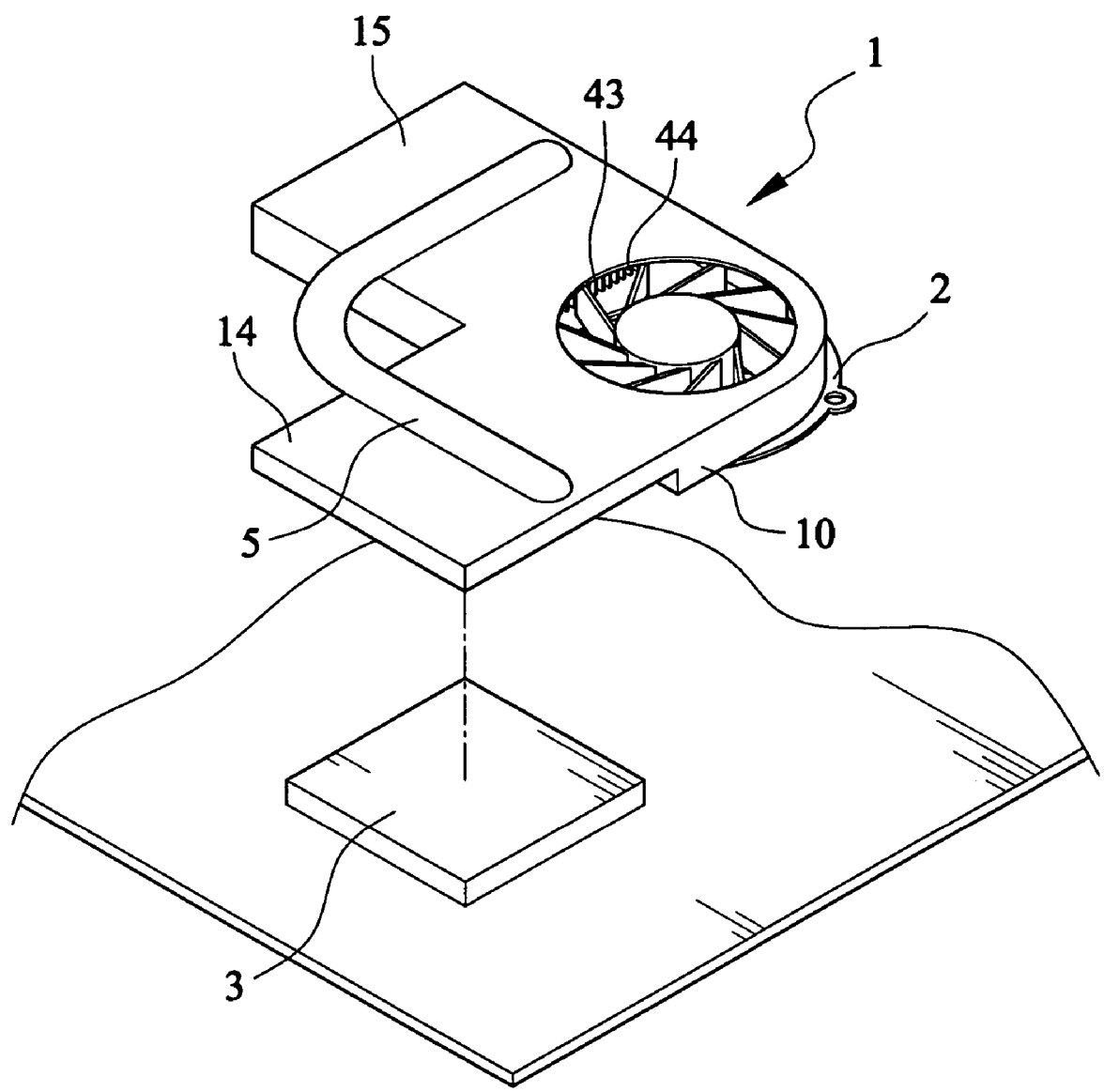
FIG. 3 is a perspective view showing the spatial relationship between the heat dissipation module of the present invention and a heat-generating electronic device mounted on a circuit board.

Also referring to FIG. 3, a lateral extension of the casing 10 forms a device contact section 14 having a surface positionable on and physically engageable with a heat-generating device 3, such as electronic device mounted on a circuit board, for example a computer central processing unit or other integrated circuits. Through heat transfer induced by conduction, heat is transmitted from the device 3 to the device contact section 14 of the casing 10 and further transmitted to other portions of the casing 10.

The casing 10 also forms an air channel 15 substantially extending in a radial direction from the fan chamber 13. Arranged in the air channel 15 is a fin module 4 having an inner end forming an airflow inlet 41 adjacent the fan 2 and an opposite outer end forming an airflow outlet 42 away from the fan 2.

Also referring to FIGS. 5–8, the fin module 4 is comprised of a plurality of fin plates 43 substantially parallel to and spaced from each other to define air passages 44 therebetween. The fin plates 43 are fixed inside the air channel 15 and in physical engagement with the portion of the casing 4 that constitutes the air channel 15. The fin plates 43 extend in a direction from the airflow inlet 41 to the airflow outlet 42 for guiding airflow from the airflow inlet 41 to the airflow outlet 42. Airflow 6 passing through each air passage 44 gets in contact with surfaces of the fin plates 42 on opposite sides of the air passage 44 and initiates heat exchange therewith by forced convection. Thus heat transmitted from the heat-generating device 3 to the casing 1 is removed by the airflow 6 passing through the air passage 44.

Optionally, a heat pipe 5 is mounted between the device contact section 14 of the casing 1 and the air channel 15 for facilitating heat transfer from the device contact section 14 to the air channel 15 to thereby enhance heat removal.

Each fin plate 43 comprises a straight leading section 43a extending from the airflow inlet 43 of the air channel 15 and a trailing section 43b in the proximity of the airflow outlet 42 of the air channel 15.

Each fin plate 43 comprises top and bottom flanges 45a, 45b substantially perpendicular to a web (not labeled) of the fin plate 43 for spacing adjacent fin plates 43 to form the air passage 44 between the adjacent fin plates 43. The flanges 45a, 45b may be optionally dimensioned to physically engage the top and bottom panels 11, 12 of the casing 1 for heat transfer and fixing purposes, otherwise means for transferring heat between the casing 1 and the fin plates 43 may be employed.

Each fin plate 43 forms, in the trailing section 43b, at least one first airflow guide tab 46 extending in a first oblique direction, marked with reference character I, and a first airflow opening 46a that is immediately adjacent to the first airflow guide tab 46. The fin plate 43 also forms at least, in the trailing section 43b thereof, at least one second airflow guide tab 47 extending in a second oblique direction, marked with reference character II, and a second airflow opening 47a that is immediately adjacent to the second airflow guide tab 47. When airflow 6 moves through the air passage 44, after passing the leading section 43a, the airflow 6 is guided by the first airflow guide tab 46 to pass through the first airflow opening 46a and get into the next airflow passage 44 and then guided by the second airflow guide tab 47 to pass through the second airflow opening 47a and get back to the original air passage 44 again. This effectively increases the length of the route that the airflow 6 moves through the air channel 15, thereby enhancing heat exchange and thus heat removal efficiency.

In the embodiment, both the first and second airflow guide tabs 46, 47 extend in a direction substantially toward the airflow inlet 41 of the air channel 15, namely in a direction against the airflow 6, but on opposite sides of the fin plate 43 and the first and second airflow openings 46a, 47a are located in front of the first and second airflow guide tabs 46, 47 whereby when the airflow 6 reaches the first airflow guide tab 46, the airflow 6 is divided into a primary component 6a that runs straight along the original air passage 44 and a secondary component 6b that is guided by the first airflow guide tab 46 to pass through the first airflow opening 46a and get into the next air passage 44. The secondary airflow component 6b is then combined with a primary airflow component of said next air passage 44. The combined airflow in said next air passage is divided again into two components of which one moves straight along said next air passage and the other is guided by the second airflow guide tab 47 to pass the second airflow opening 47a and get back into the original air passage where said other component combines with the primary airflow component 6a of the original air passage 44 and eventually gets out of the airflow outlet 42 of the air channel 15.

In the embodiment illustrated, two first airflow guide tabs 46 and one single second airflow guide tab 47 are formed in each fin plate 43. However, it is apparent to those having ordinary skills to form, in each fin plate 43, a plurality of first and second airflow guide tabs 46, 47, as well as first and second airflow openings 46a, 47a. The first and second tabs 46, 47 are arranged in a staggered and alternate manner and diverge in opposite directions on opposite sides of the fin plate 43 to alternately guide airflow from the one air passage the adjacent air passage and back to said one air passage. This effectively increases the heat exchange efficiency between the fin plates 43 and the airflows 6 and heat removal can be enhanced.

The fin plates 43 can be efficiently and economically made by stamping on metal plates having high heat conduction coefficient.

Figure 9:
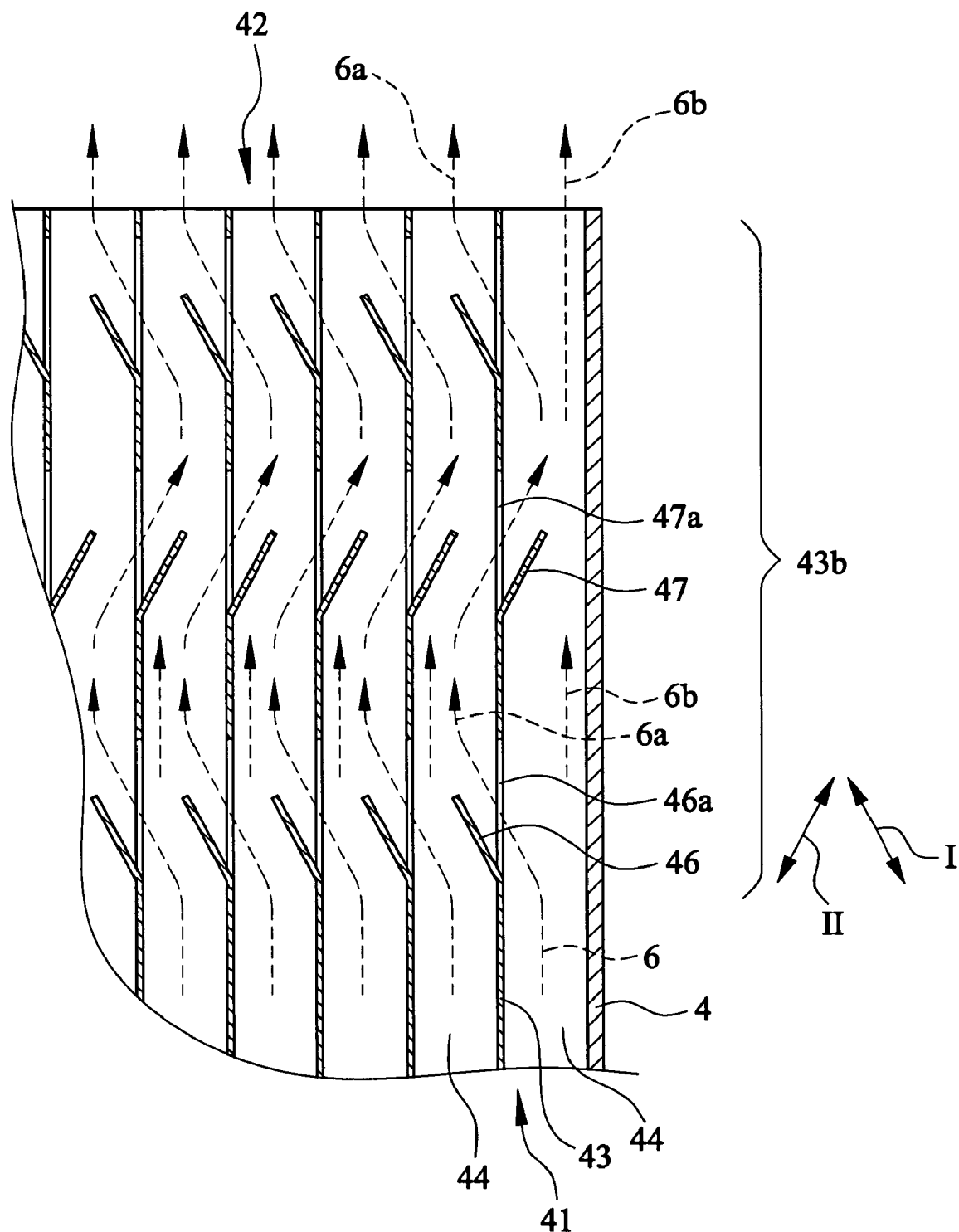
FIG. 9 is similar to FIG. 8 but showing another embodiment of the air channel of the present invention.

Also referring to FIG. 9, a different configuration of the fin module is shown, the fin module is comprised of a plurality of fin plates 43 parallel to and spaced from each other, preferably by top and bottom flanges extending from each fin plate 43, to form therebetween air passages 44 extending from the airflow inlet 41 of the air channel 15 to the airflow outlet 42. Each fin plate 43 has a trailing section 43b forming at least one first airflow guide tab 46 and at least one second airflow guide tab 47 both extending in an oblique direction toward the airflow outlet 42 of the air channel 15, namely in the direction in compliance with the airflow 6. The first and second airflow guide tabs 46, 47 are arranged in an staggered and alternate manner and each is associated with a first or second airflow openings 46a, 47a immediately closed to and located behind the tab 46, 47. Airflow 6, when arriving at the first airflow opening 46a is divided into two components 6a, 6b. One component 6a flows into the next air passage by being guided by the first airflow guide tab 46, while the other component 6b remains in and moves along the original air passage. The component 6a flowing into the next air passage is combined with the air flow of the next passage and moves along the next passage until it reaches the second airflow opening 47a where the airflow is divided into two components again, with one component flowing through the second opening 47a back into the original air passage and combining with the airflow moving along the original air passage.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A heat dissipation module for dissipating heat from a heat-generating device comprising:
   an airflow generation device that generates an airflow;
   an air channel having an inlet receiving the airflow and an outlet on an end of the air channel opposing the inlet; and
   a fin module received and fixed in the air channel between the inlet and the outlet thereof for guiding the airflow from the inlet through the air channel to the outlet, the fin module comprising a plurality of fin plates substantially parallel to and spaced from each other to define therebetween air passages through each of which the air flow passes, each fin plate comprising:
   a trailing section positioned at the outlet of the air channel, the trailing section having formed thereon at least one first guide tab extending in a first oblique direction and having formed therein a first opening immediately adjacent to the first guide tab, the trailing section having formed thereon at least one second guide tab extending in a second oblique direction and having formed therein a second opening immediately adjacent to the second guide tab, wherein the first and second guide tabs are arranged in an alternating manner along the trailing section so as to guide at least a portion of air of the airflow in an air passage on one side of the fin plate to to flow in an adjacent air passage defined by an opposite side of the fin plate; and
   a leading section extending from the trailing section to the inlet of the air channel, the leading section having a smooth continuous surface at least equal in length to the trailing section.

2. The heat dissipation module as claimed in claim 1, wherein each fin plate comprises a web having top and bottom edges from which top and bottom flanges extend, respectively, for spacing adjacent fin plates to form the air passages.

3. The heat dissipation module as claimed in claim 1, wherein the first and second guide tabs are extended in opposite directions on opposite sides of the fin plate.

4. The heat dissipation module as claimed in claim 1, wherein the first and second guide tabs are formed by stamping the fin plate.

5. A heat dissipation module for dissipating heat from a heat-generating device comprising:
   an airflow generation device that generates an airflow radially directed thereto; and
   an air channel having an inlet receiving the airflow and an outlet on an end of the air channel opposing the inlet; and
   a fin module received and fixed in the air channel between the inlet and the outlet for guiding the airflow from the inlet through the air channel to the outlet, the fin module comprising a plurality of fin plates substantially parallel to and spaced from each other to define therebetween air passages through each of which the air flow passes, each fin plate comprising:
   a trailing section positioned at the outlet of the air channel, the trailing section having formed thereon at least one guide tab extending in an oblique direction and and having formed therein an opening immediately adjacent to the guide tab for guiding at least a portion of the air from an air passage on one side of the fin plate to an air passage on an opposite side of the fin plate; and
   a leading section extending from the trailing section to the inlet of the air channel, the leading section having a smooth continuous surface at least equal in length to the trailing section.

6. The heat dissipation module as claimed in claim 5, wherein each fin plate comprises a web having top and bottom edges from which top and bottom flanges extend, respectively, for spacing adjacent fin plates to form the air passages.

7. The heat dissipation module as claimed in claim 5, wherein the guide tab is formed by stamping the fin plate.

8. A heat dissipation module for dissipating heat from a heat-generating device comprising:
   a casing comprising top and bottom panels spaced from each other to define an interior space, aligned openings being defined in the top and bottom panels to form a fan chamber;
   a fan received and fixed in the fan chamber to generate an airflow;
   an air channel extending from the fan chamber and having an inlet adjacent the fan chamber to receive the airflow and an outlet on an end of the air channel opposing the inlet;
   a fin module received and fixed in the air channel between the inlet and the outlet and comprising a plurality of fin plates substantially parallel to and spaced from each other to define therebetween air passages extending from the inlet to the outlet, each fin plate comprising:
   a trailing section positioned at the outlet of the air channel, the trailing section having formed thereon at least one guide tab extending in an oblique direction and having formed therein an opening immediately adjacent to the guide tab for guiding at least a portion of the air to to flow alternately between two air passages on opposite sides of the fin plate; and
   a leading section extending from the trailing section to the inlet of the air channel, the leading section having a smooth continuous surface at least equal in length to the trailing section.

9. The heat dissipation module as claimed in claim 8, wherein each fin plate comprises a web having top and bottom edges from which top and bottom flanges extend, respectively, for spacing adjacent fin plates to form the air passages.

10. The heat dissipation module as claimed in claim 8, wherein the trailing section of each fin plate comprises:

at least one first guide tab extending in a first oblique direction and a first opening defined in the fin plate immediately adjacent to the first guide tab; and at least one second guide tab extending in a second oblique direction and a second opening defined in the fin plate immediately adjacent to the second guide tab.

11. The heat dissipation module as claimed in claim 8, wherein the guide tab is formed by stamping the fin plate.

12. The heat dissipation module as claimed in claim 1, wherein the air channel is formed in a casing, the casing further including a fan chamber for receiving the airflow generating device, the inlet of the air channel located on a radial periphery of the fan chamber.

13. The heat dissipation module as claimed in claim 12, wherein the fan chamber has formed therein an air intake opening coaxially aligned with the airflow generation device and orthogonal to the airflow.

14. The heat dissipation module as claimed in claim 12, further including a device contact section formed on the casing and in physical contact with the heat-generating device, the device contact section defining a thermal conduction path from the heat-generating device to the periphery of the fan chamber.

15. The heat dissipation module as claimed in claim 14, further including a heat pipe on an external surface of the casing, the heat pipe connected to the device contact section and to the air channel.

16. The heat dissipation module as claimed in claim 5, wherein the air channel is formed in a casing, the casing further including a fan chamber for receiving the airflow generating device, the inlet of the air channel located on a periphery of the fan chamber.

17. The heat dissipation module as claimed in claim 16, wherein the fan chamber has formed therein an air intake opening coaxially aligned with the airflow generation device.

18. The heat dissipation module as claimed in claim 16, further including a device contact section formed on the casing and in physical contact with the heat-generating device, the device contact section defining a thermal conduction path from the heat-generating device to the periphery of the fan chamber.

19. The heat dissipation module as claimed in claim 18, further including a heat pipe on an external surface of the casing, the heat pipe connected to the device contact section and to the air channel.

20. The heat dissipation module as claimed in claim 8, further including a device contact section formed on the casing and in physical contact with the heat-generating device, the device contact section defining a thermal conduction path from the heat-generating device to the periphery of the fan chamber.

* * * * *